United States Patent [19]

Nakamura et al.

[11] Patent Number: 5,117,148
[45] Date of Patent: May 26, 1992

[54] VIBRATOR

[75] Inventors: Takeshi Nakamura; Katsumi Fujimoto; Jiro Inoue, all of Nagaokakyo, Japan

[73] Assignee: Murata Manufacturing Co., Ltd., Nagaokakyo, Japan

[21] Appl. No.: 606,286

[22] Filed: Oct. 31, 1990

[30] Foreign Application Priority Data

| Nov. 7, 1989 | [JP] | Japan | 1-290757 |
| Aug. 27, 1990 | [JP] | Japan | 2-225842 |
| Aug. 27, 1990 | [JP] | Japan | 2-225843 |
| Aug. 27, 1990 | [JP] | Japan | 2-225844 |

[51] Int. Cl.$^5$ .............................. H01L 41/08
[52] U.S. Cl. ................... 310/367; 310/358; 310/366; 310/369; 310/319
[58] Field of Search .................. 310/367–369, 310/366, 358, 359

[56] References Cited

U.S. PATENT DOCUMENTS

| 2,439,499 | 4/1948 | Williams et al. | 310/331 |
| 2,540,412 | 2/1951 | Adler | 310/358 |
| 2,944,118 | 7/1960 | Gray | 310/367 |
| 2,955,216 | 10/1960 | Dieter, Jr. | 310/369 |
| 3,114,849 | 12/1963 | Poschenrieder | 310/366 |
| 3,117,189 | 1/1964 | Kopp | 310/369 |
| 3,168,623 | 2/1965 | Petermann | 310/358 |
| 3,784,849 | 1/1974 | Cooper | 310/366 |

FOREIGN PATENT DOCUMENTS 509826  7/1976  U.S.S.R. .............. 310/367

Primary Examiner—Mark O. Budd
Attorney, Agent, or Firm—Armstrong, Nikaido, Marmelstein, Kubovcik & Murray

[57] ABSTRACT

The vibrator includes a columnar vibrating body consisting of a piezoelectric material. The vibrating body is formed into a polygonal or cylindrical column and, when necessary, a through hole is formed axially thereof. Furthermore, the vibrating body is polarized. On side faces of the vibrating body, at least three external electrodes are formed. Also, when the through hole is to be formed, an internal electrode is formed on its inner circumferential surface. By applying the driving signal to these electrodes, the vibrating body bends and vibrates. And, when the rotational angular velocity is applied to the vibrating body about its axis, a coriolis force is produced responsive thereto. By this coriolis force, the vibrating direction of the vibrating body changes, and a voltage is produced between the two external electrodes. By measuring the voltage, the rotational angular velocity applied to the vibrator can be measured.

4 Claims, 14 Drawing Sheets

F I G. 5
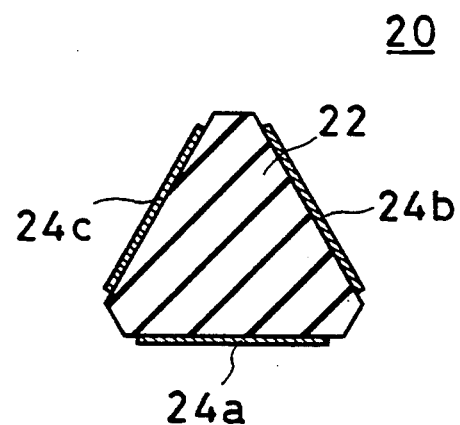

F I G. 11
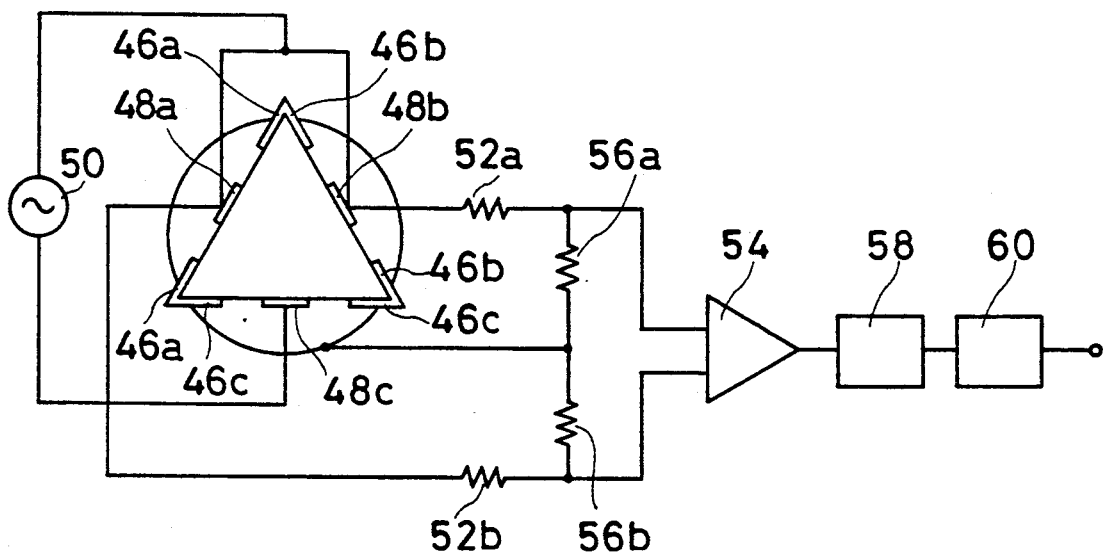
F I G. 12
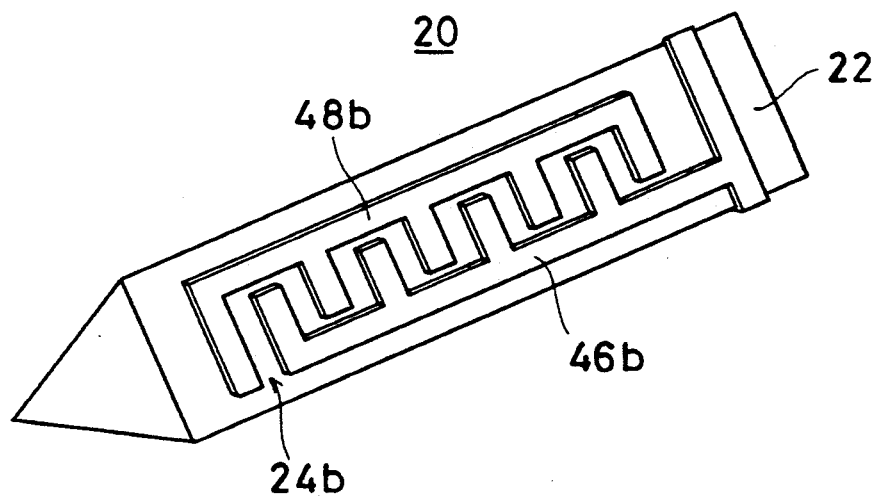

F I G. 13
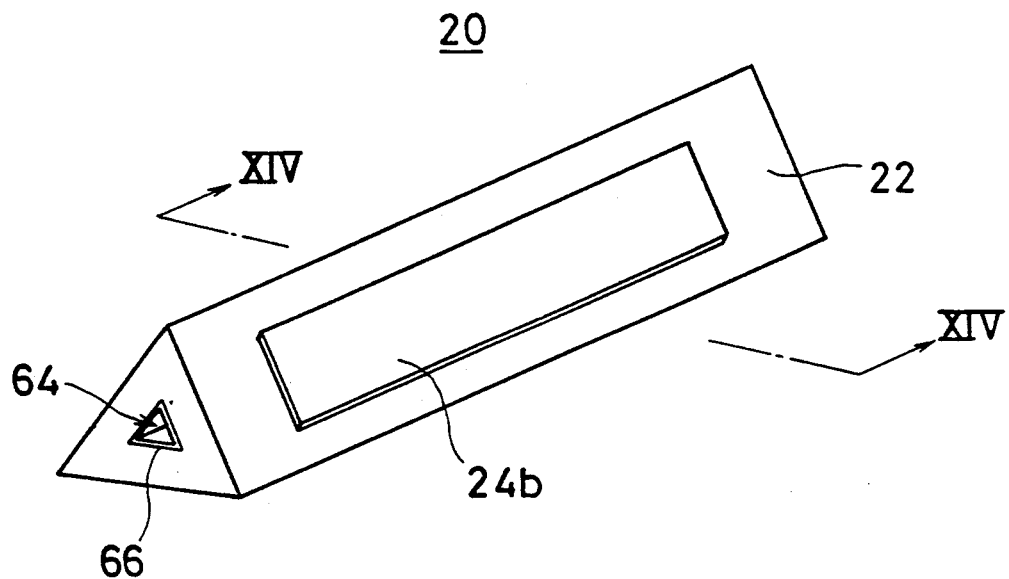
F I G. 14
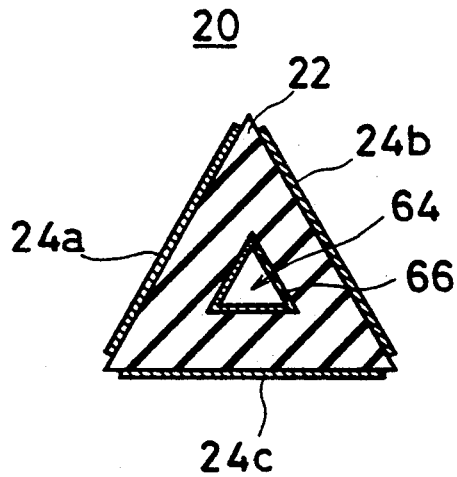

F I G. 15
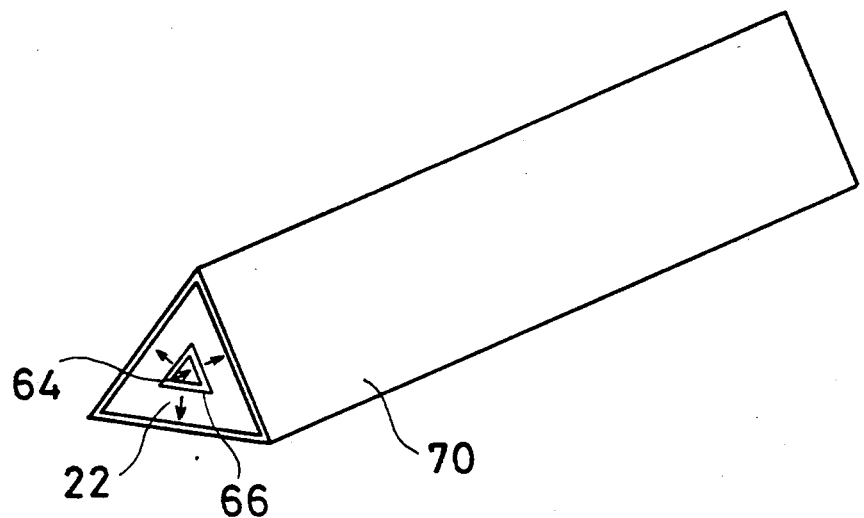
F I G. 16
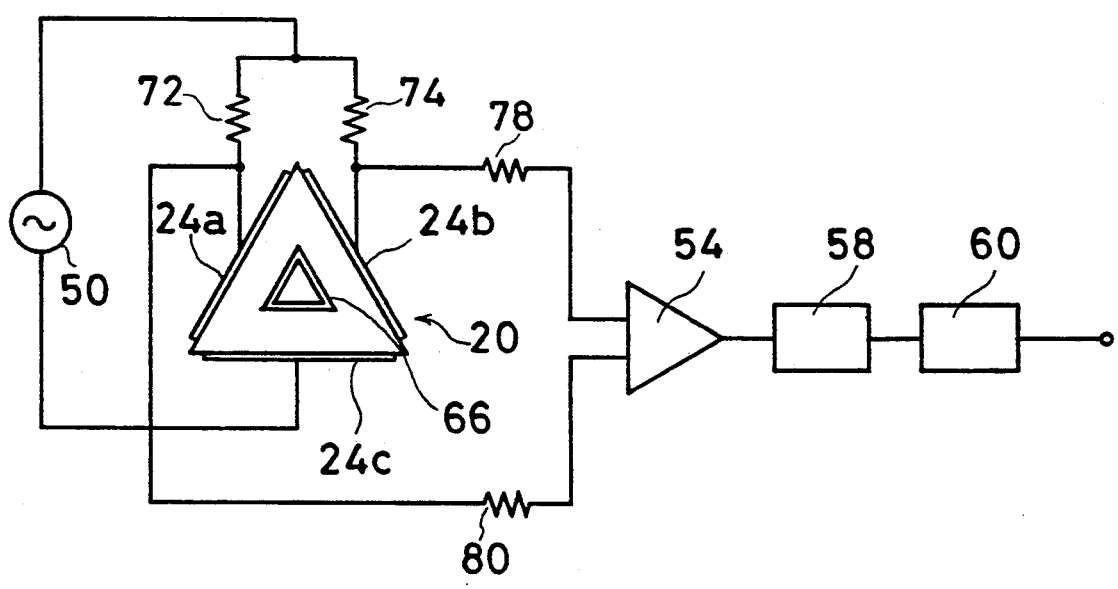

F I G.17
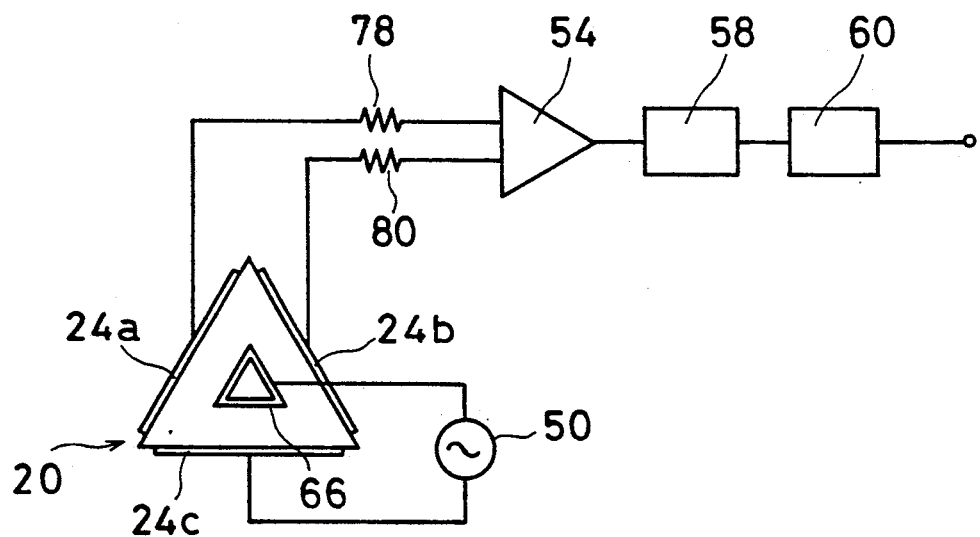
F I G.18
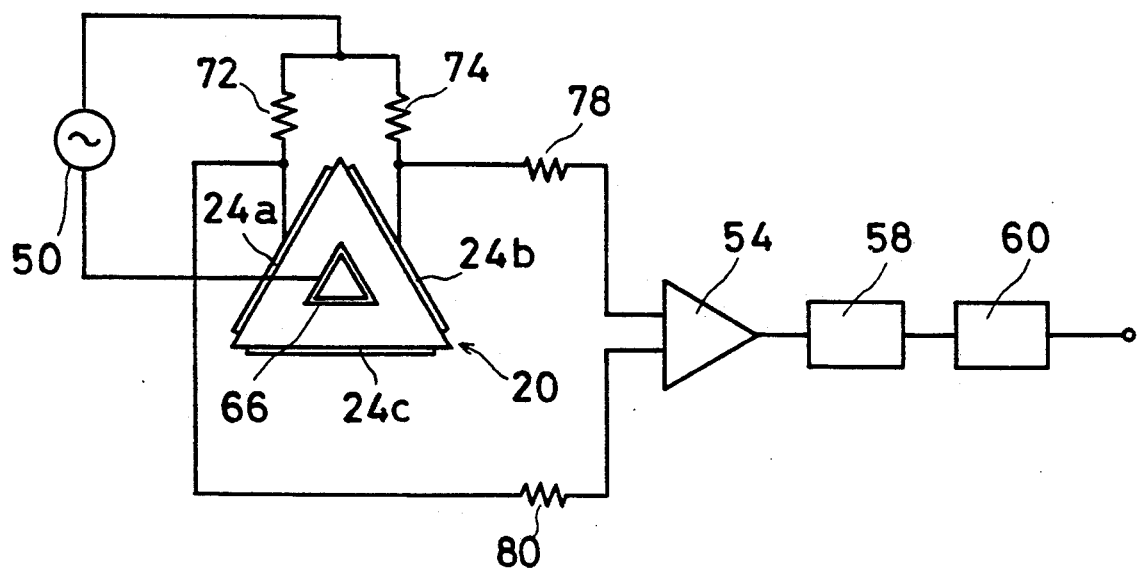

F I G. 19
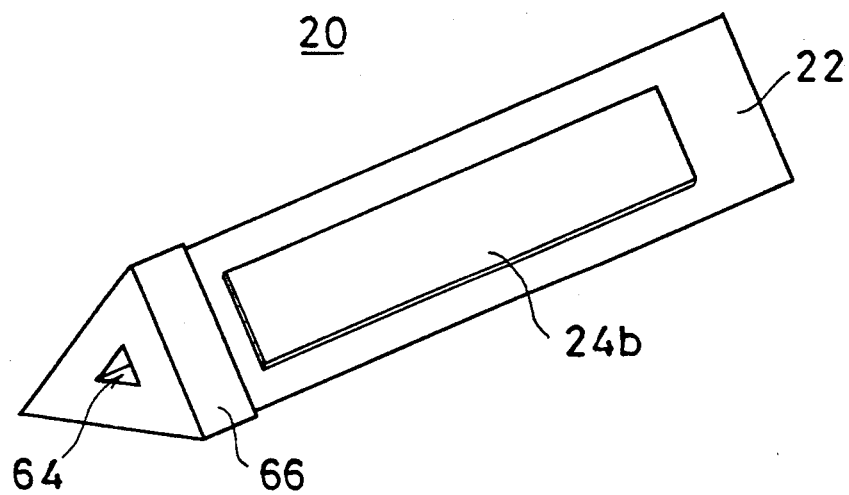
F I G. 20
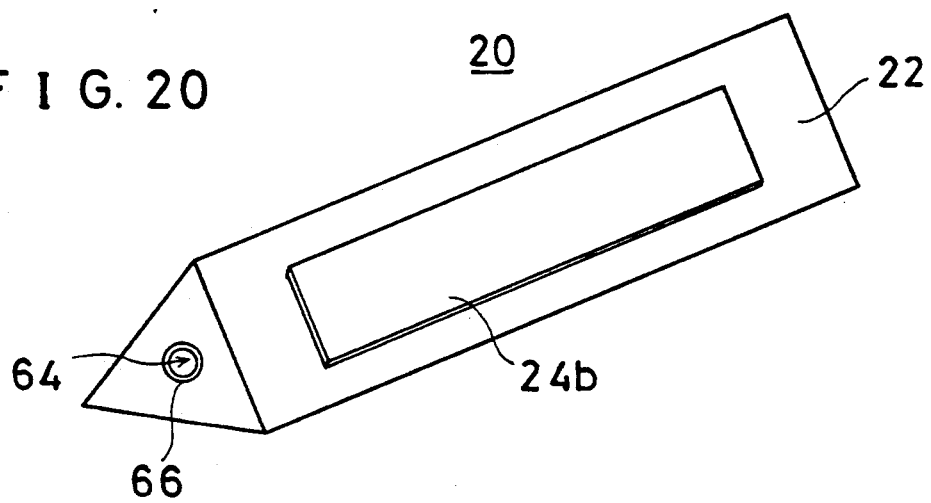
F I G. 21
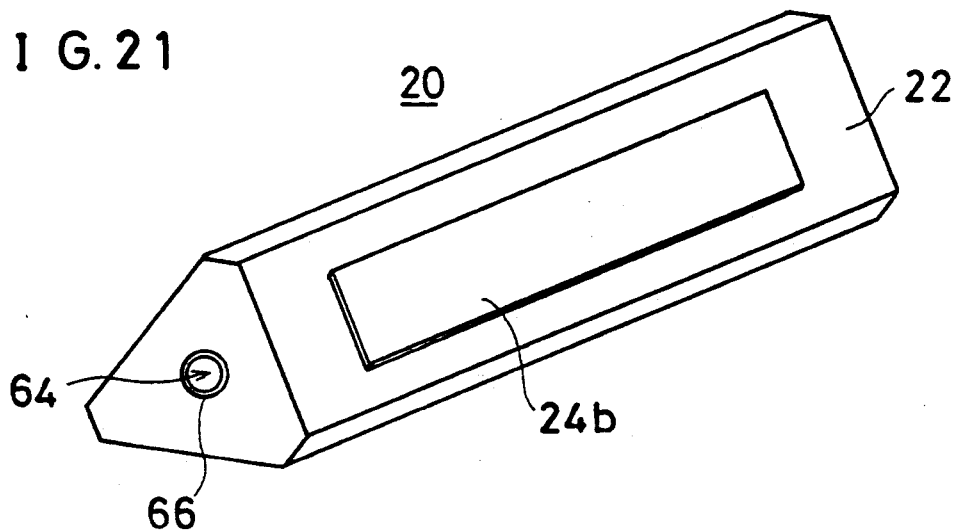

VIBRATOR

BACKGROUND OF THE INVENTION

1. Field of the Invention

The present invention relates to a vibrator. Particularly, it relates to a vibrator used in an apparatus utilizing vibration such as a vibrating gyroscope or an angular velocity sensor, used in detecting shaking of hands in a video camera or the attitude control for an automobile.

2. Description of the Prior Arts

FIG. 26 is a perspective view showing an example of a conventional vibrator, and FIG. 27 is a transverse sectional view thereof. The vibrator 1 includes a regular triangle columnar vibrating body 2 consisting of a constant elastic metal material such as elinvar, and at the center of three side faces of the vibrating body 2, stripped piezoelectric element 3a, 3b and 3c are bonded respectively. That is, the piezoelectric element 3a consists of electrodes 5a and a formed on both surfaces of a piezoelectric layer 4a, with one electrode 5a being bonded to one side face of the vibrating body 2. Similarly, the piezoelectric elements 3b and 3c respectively consist of electrodes 5b, 6b and 5c, 6c formed on both surfaces of piezoelectric layers 4b and 4c, with one electrodes 5b and 5c being bonded respectively to the other two side faces of the vibrating body 2. The vibrating body 2 is supported by a supporting member in the neighborhood of its nodal point.

When using the vibrating gyroscope, for example, one piezoelectric element 3a is used for feedback and the other two piezoelectric elements 4b and 4c are used for driving and detection, and furthermore, the vibrating body 2 is grounded.

FIG. 28 is a circuit diagram showing an example of such a vibrating gyroscope.

That is, in the vibrating gyroscope 7, the other electrode 6a of the piezoelectric element 3a for feedback of the vibrator 1 constitutes a portion of a feedback loop for driving the vibrator 1, and through an inversion amplifier circuit 8 having an operational amplifier 8a, is connected, for example, to the input side of a phase correcting circuit 9 consisting of a 2-stage RC filter. The output side of the phase correcting circuit 9 is connected respectively to the electrodes 6b and 6c of the other piezoelectric elements 3b and 3c, through fixed resistances 10a and 10b. The vibrating body 2 of the vibrator 1 is grounded by an earth terminal 11 made of a metal. Meanwhile, the electrodes 6b and 6c of the two piezoelectric elements 3b and 3c are connected respectively to a non-inversion input end and an inversion input end of a differential amplifier 12.

In the vibrating gyroscope 7, since the output from the piezoelectric element 3a is fed back to the two piezoelectric elements 3b and 3c through the inversion amplifier circuit 8 and so on, the vibrator 1 is subjected to self-oscillation.

Then, in this state, when the vibrator 1 is rotated about its axis, a voltage corresponding to its rotational angular velocity is produced between the two piezoelectric elements 3b and 3c. This voltage is detected in the differential amplifier 12 and outputted.

Accordingly, in the vibrating gyroscope 7, the rotational angular velocity can be known by the output of the differential amplifier 12.

However, in the aforesaid vibrator 1, since the piezoelectric elements 3a-3c are bonded to the vibrating body 2, it is difficult to make it in a very small size. That is, in case of making the vibrating body 2 too small, the piezoelectric elements 3a-3c can not be bonded accurately at the center of the side faces of the vibrating body 2.

Also, in the vibrator 1, since a constant elastic metal material is used as the vibrator body 2, it is very costly.

Moreover, the coefficients of thermal expansion of the vibrating body 2 and the piezoelectric elements 3a-3c are different, so that variations occur at the bonded portion due to changes in atmospheric temperature, thereby causing characteristic variations.

In addition, for driving the vibrator 1, not only the vibrating body 2 must be grounded, but also the phase correcting circuit is necessary in a feedback loop for driving, the circuit configuration becomes complicated.

SUMMARY OF THE INVENTION

Therefore, it is a primary object of the present invention to provide a vibrator which is less expensive and possible to be made very smaller, and in which characteristic variations can be minimized and moreover, it can be driven with a simple circuit.

The present invention is directed to a vibrator including a columnar vibrating body consisting of a piezoelectric material, and, at least, three electrodes formed on the side faces of the vibrating body.

In the vibrator, a piezoelectric material is used as the vibrating body and a constant elastic metal material is not used. Since the vibrating body is formed with the piezoelectric material, when this vibrating body is polarized, the vibrating body itself bends and vibrates by applying the signal to the electrodes.

Moreover, on the side face of the vibrating body, the piezoelectric element is not bonded but the electrode is formed. In this case, even when the vibrating body is formed smaller, the electrode can be formed accurately on the side face of the vibrating body, for example, by vacuum evaporation and sputtering.

This vibrator performs self-oscillation when a driving feedback loop is connected between, at least, one electrode and the other electrodes. In this case, the vibrating body is not needed to be grounded. Furthermore, as the vibrating body is not grounded, a phase at a resonance point becomes 0° or 180°, so that a phase correcting circuit is not necessary in the driving feedback loop.

According to the present invention, a vibrator which is less expensive and possible to be made very smaller, and in which characteristic variations can be minimized and moreover, can be driven with a simple circuit is obtained.

These and other objects, features, aspects and advantages of the present invention will become more apparent from the detailed description of the following embodiments described in connection with the accompanying drawings.

BRIEF DESCRIPTION OF THE DRAWINGS

FIG. 5 is a transverse sectional view showing a modified example of a vibrator shown in FIG. 1 and FIG. 2.

FIG. 7 is polarized.

FIG. 11 is a circuit diagram showing another example of an angular velocity detecting circuit shown in FIG. 9.

FIG. 12 is a perspective view showing another example of a vibrator shown in FIG. 6 and FIG. 7.

FIG. 13 is a perspective view showing still another embodiment of the present invention, and FIG. 14 is a sectional view taken along the line XIV—XIV of FIG. 13.

FIG. 15 is a perspective view showing a process of manufacturing a vibrator shown in FIG. 13 and FIG. 14.

FIG. 16 is a circuit diagram showing an example of an angular velocity detecting circuit using a vibrator shown in FIG. 13 and FIG. 14.

FIG. 17 is a circuit diagram showing another example of an angular velocity detecting circuit shown in FIG. 16.

FIG. 18 is a circuit diagram showing still another example of an angular velocity detecting circuit shown in FIG. 16.

FIG. 19 is a perspective view showing another example of a vibrator in FIG. 13 and FIG. 14.

FIG. 20 is a perspective view showing still another example of a vibrator shown in FIG. 13 and FIG. 14.

FIG. 21 is a perspective view showing a separate example of a vibrator shown in FIG. 13 and FIG. 14.

DESCRIPTION OF THE PREFERRED EMBODIMENTS

Figure 1:
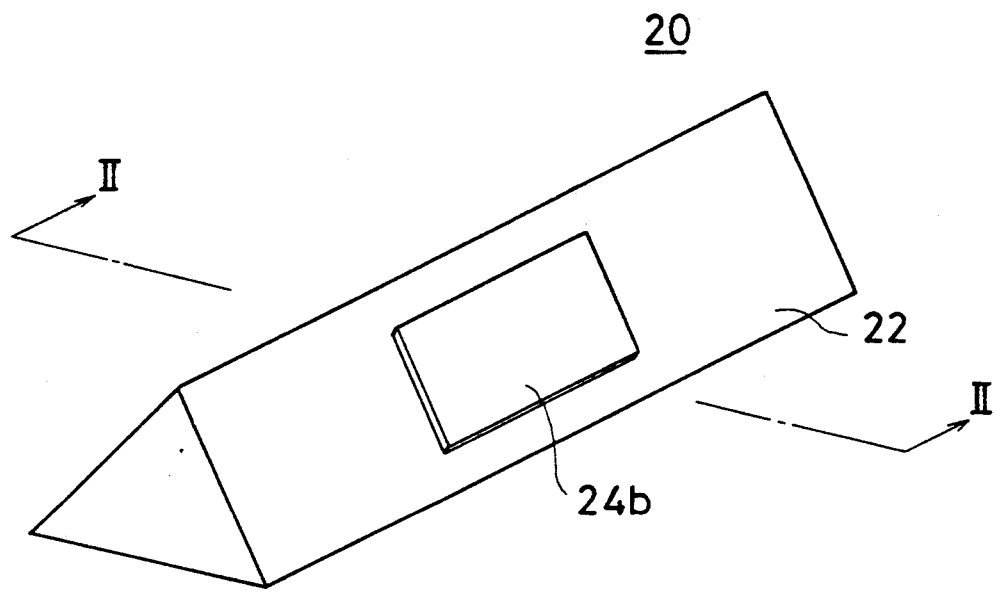
FIG. 1 is a perspective view showing one embodiment of the present invention and FIG. 2 is a sectional view taken along the line II—II of FIG. 1.
Figure 2:
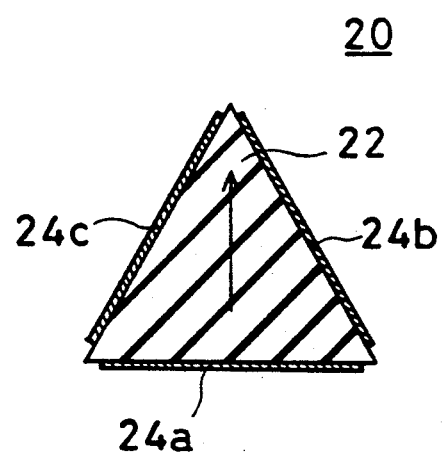

FIG. 1 is a perspective view showing one embodiment of the present invention, and FIG. 2 is a sectional view taken along the line II—II of FIG. 1.

The vibrator 20 includes a regular triangle columnar vibrating body 22 consisting of, for example, a piezoelectric material such as crystal and ceramics. The vibrating body 22, as indicated by the arrow in FIG. 2, shows a polarization or piezoelectricity in the direction generally orthogonal to one side face. The vibrating body 22 is formed by, for example, the following method.

First, a piezoelectric plate consisting of a piezoelectric material having generally the same thickness as the height of vibrating body 22 is prepared. Then, a DC voltage is applied between two surfaces of the piezoelectric plate to polarize the piezoelectric plate in the direction generally orthogonal to the surface. And then, the piezoelectric plate is cut into a regular triangle columnar shape, such that the polarized piezoelectric plate surface makes one side face, to form the vibrating body 22.

At the center of the three side faces of the vibrating body 22, external electrodes 24a, 24b and 24c are formed respectively. These external electrodes 24a-24c are formed respectively by an electrode material such as gold, silver, copper, nickel or aluminum by, for example, a vacuum evaporation and sputtering method. Therefore, even when the vibrating body 22 is made in a small size, the external electrodes 24a-24c are formed accurately thereon. The vibrating body 22 may be polarized by using the external electrodes after forming the external electrodes 24a-24c.

Figure 26:
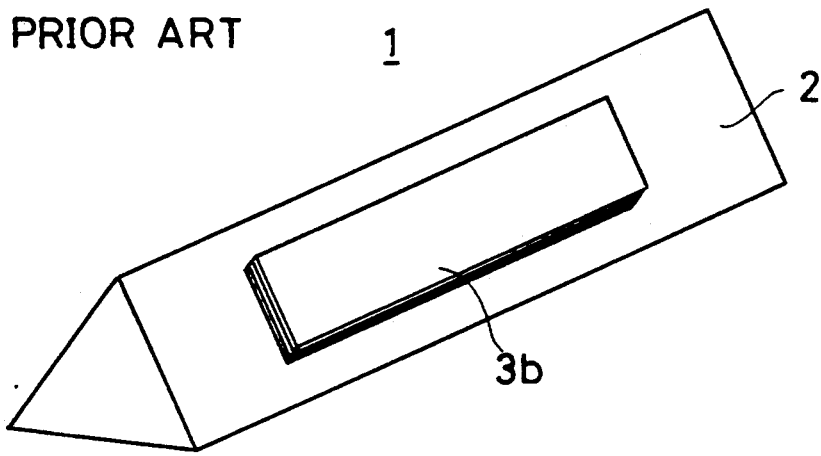
FIG. 26 is a perspective view showing an example of a conventional vibrator which is the background of the present invention.
Figure 27:
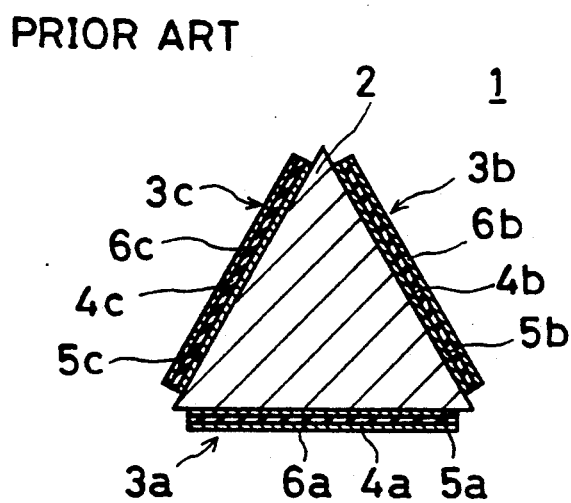
FIG. 27 is a transverse sectional view of a conventional vibrator shown in FIG. 26.
Figure 28:
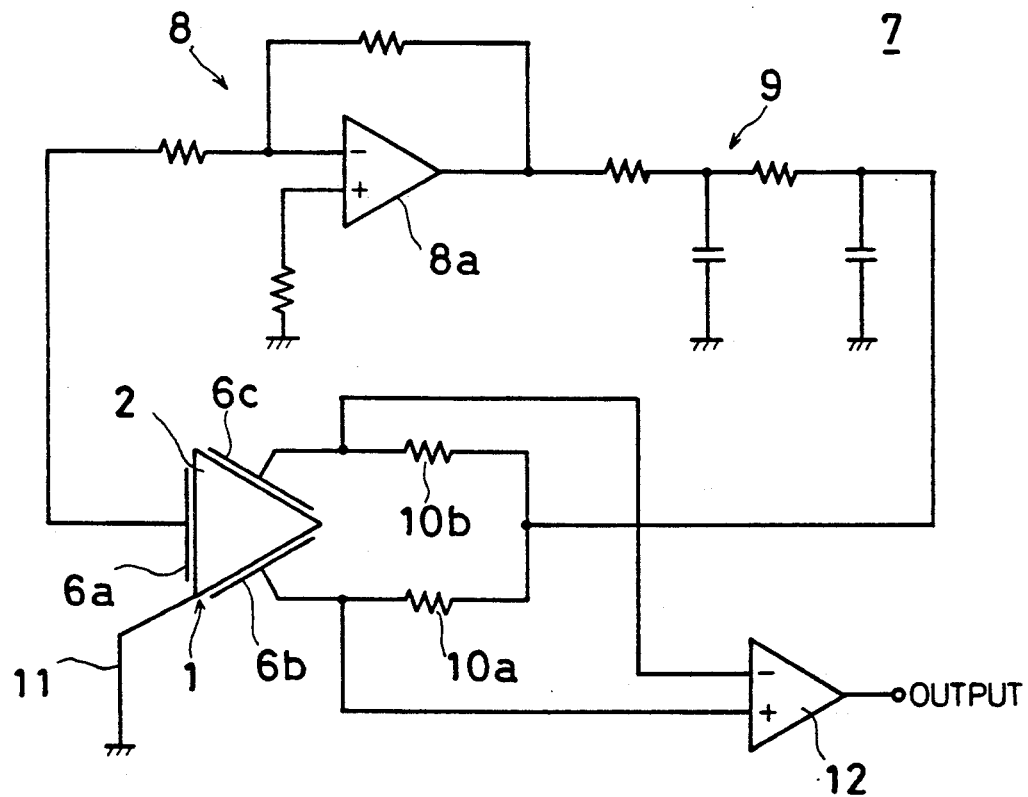
FIG. 28 is a circuit diagram showing an example of a vibrating gyroscope using a vibrator shown in FIG. 26 and FIG. 27.

In the vibrator 20, since the piezoelectric material is used as the vibrating body 22 and the constant elastic metal material is not used, it is less expensive as compared with the conventional vibrator shown in FIG. 26 and FIG. 27. Besides, even when the vibrating body 22 is made smaller, the external electrodes 24a-24c can be formed accurately thereon, so that it can be made in a very small size. Therefore, this vibrator 20 may be used effectively in an apparatus such as a vibrating gyroscope for preventing shaking of hands in a camera.

Next, with reference to FIG. 3, the vibrating gyroscope using the vibrator 20 will be described.

In the vibrating gyroscope 30, in the vibrator 20, for example, one external electrode 24a is used for feedback and the other two external electrodes 24b and 24c are used for driving and detection.

Thus, the external electrode 24a of the vibrator 20 constitutes a portion of the feedback loop for driving the vibrator 20, and is connected to the input side of an inversion amplifier circuit 32 having an operational amplifier 32a. The output side of the inversion amplifier circuit 32 is connected to, for example, the input side of an RC filter 34 for preventing spurious signals. The output side of the RC filter 34 is connected to the other two external electrodes 24b and 24c through fixed resistances 36a and 36b respectively. The RC filter 34 need not, necessarily, be installed. In this case, the output side of the inversion amplifier circuit 32 is connected respectively to the two electrodes 24b and 24c through the fixed resistances 36a and 36b respectively.

Meanwhile, the two external electrodes 24b and 24c are connected respectively to the non-inversion input end and the inversion input end of a differential amplifier 38.

In the vibrating gyroscope 30, the output from the external electrode 24a of the vibrator 20 is fed back to the two external electrodes 24b and 24c of the vibrator 20, through the inversion amplifier circuit 32 and so on. Thus, the vibrator 20 performs self oscillation.

Then, in this state, as the vibrator 20 is rotated about it axis, a coriolis force is exerted in the direction orthogonal to the bending and vibrating direction. Thus, the vibrating direction of the vibrating body 22 shifts from the non-rotational vibrating direction. Therefore, a voltage corresponding to the rotational angular velocity is produced between the two external electrodes 24b and 24c of the vibrator 20. This voltage is detected in the differential amplifier 38 and outputted. Accordingly, in the vibrating gyroscope 30, the rotational angular velocity can be known by the output of the differential amplifier 38.

As aforementioned, in the vibrator 20, as compared with the conventional vibrator shown in FIG. 26 and FIG. 27, a phase correcting circuit is not necessary in a feedback loop for driving the vibrator, and can be driven by a simple circuit.

Also, in the vibrator 20, since the vibrating body 22 is formed with the piezoelectric material, the piezoelectric elements are not necessary to be bonded to the side faces of the vibrating body as the conventional one. Thus, vibrations in the bonded portion do not occur due to the difference in heat expansion coefficients between the vibrating body and the piezoelectric element by changes of the atmospheric temperature, results in little characteristic variations.

Moreover, since the piezoelectric element is not bonded to the vibrating body and the external electrodes can be formed by the vacuum evaporation or sputtering method, the vibrator can be made smaller.

Figure 3:
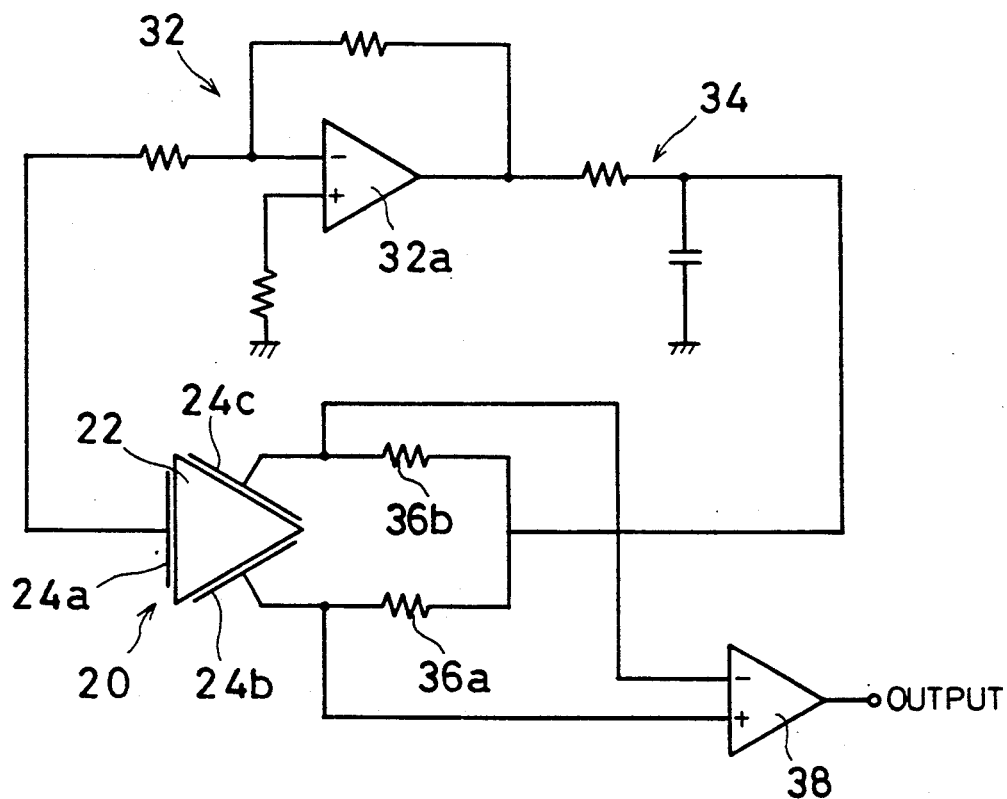
FIG. 3 is a circuit diagram showing an example of a vibrating gyroscope using a vibrator shown in FIG. 1 and FIG. 2.
Figure 4:
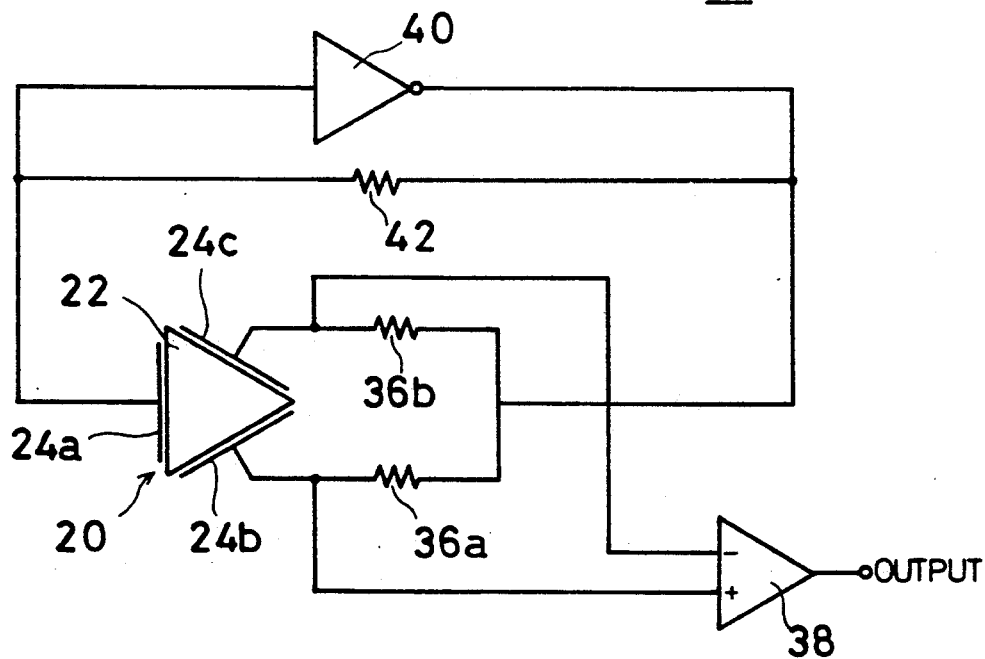
FIG. 4 is a circuit diagram showing another example of a vibrating gyroscope using a vibrator shown in FIG. 1 and FIG. 2.

FIG. 3 is a circuit diagram showing another example of a vibrating gyroscope using the aforesaid vibrator 20.

In this vibrating gyroscope 30, particularly, as a feedback loop for driving the vibrator 20, an invention amplifier 40 is used in lieu of an inversion amplifier circuit. That is, the inversion amplifier 40 has its input end connected to the external electrode 24a of the vibrator 20, and its output end connected respectively to the other two external electrodes 24b and 24c through the fixed resistances 36a and 36b. Meanwhile, the input and output ends of the inversion amplifier 40 are connected via a fixed resistance 42.

Also, in the vibrating gyroscope 30, as same as the vibrating gyroscope shown in FIG. 3, it is driven and the rotational angular velocity can be known.

In the embodiment aforementioned, though the vibrating body 22 of the vibrator 20 is formed into a regular triangle column, in the present invention, it may be formed, for example, into a hexagonal column shown in FIG. 5 or any other polygonal column. When the vibrating body is formed with four or more side faces, electrodes may be formed respectively on not only three but on four or more side faces.

Figure 6:
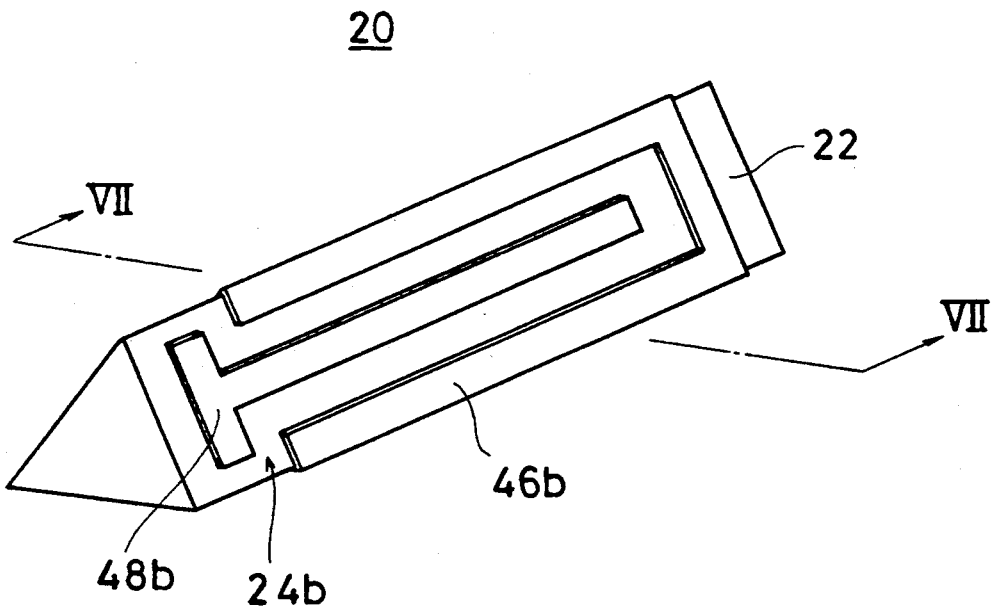
FIG. 6 is a perspective view showing another of the present invention.
Figure 7:
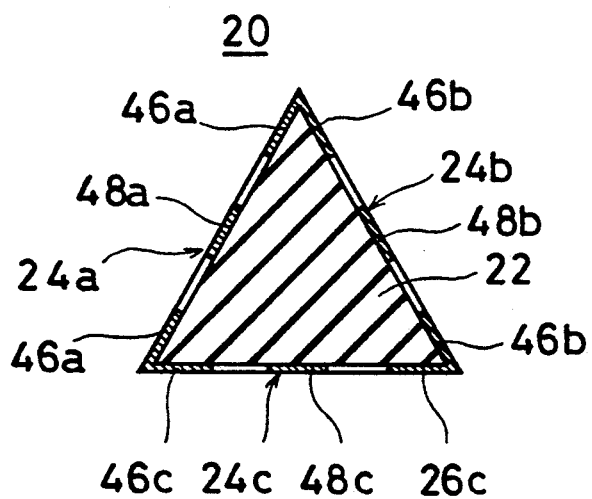
FIG. 7 is a sectional view taken along the line VII—VII of FIG. 6.

FIG. 6 is a perspective view showing another embodiment of the present invention, and FIG. 7 is a sectional view taken along the line VII—VII of FIG. 6. The vibrator 20 includes the vibrating body 22. The vibrating body 22 is consisting of piezoelectric ceramics and piezoelectric crystal such as lithium tantalate, and formed into a regular triangle column.

On three side faces of the vibrating body 22, inter-digital electrodes 24a, 24b and 24c are formed respectively as external electrodes. The inter-digital electrode 24a is formed by a pair of comblike electrodes 46a and 48a. These comblike electrodes 46a and 48a are formed by extending in the longitudinal direction of the vibrating body 22, and are arranged so as to incorporate with each other.

Similarly, the inter-digital electrode 24b is formed by a pair of comblike electrodes 46b and 48b so as to incorporate with each other, and the inter-digital electrode 24c is formed by a pair of comblike electrodes 46c and 48c which are so arranged to incorporate with each other.

The comblike electrodes 46a, 46b and 46c of the inter-digital electrodes 24a, 24b and 24c are connected respectively to each of the corner edges of the vibrating body 22. Meanwhile, the vibrating body 22 is polarized from the comblike electrodes 48a toward 46a as indicated by the arrow in FIG. 8. Similarly, the vibrating body 22 is polarized from the comblike electrodes 48b toward 46b, and from 48c toward 46c.

Figure 8:
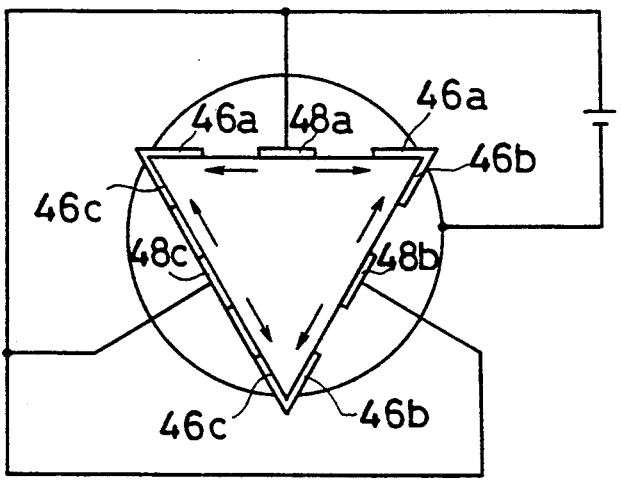
FIG. 8 is an illustrative view showing the state wherein a vibrator shown in FIG. 6

For polarization, as shown in FIG. 8, the comblike electrodes 48a, 48b and 48c may be connected, and an electric field is applied between these electrodes and the comblike electrodes 46a, 46b and 46c. In this case, the comblike electrodes 48a, 48b and 48c may be formed so as to be connected with each other at the other end of the vibrating body 22, and after polarizing the vibrating body 22, the comblike electrodes 48a, 48b and 48c may be cut off.

Figure 9:
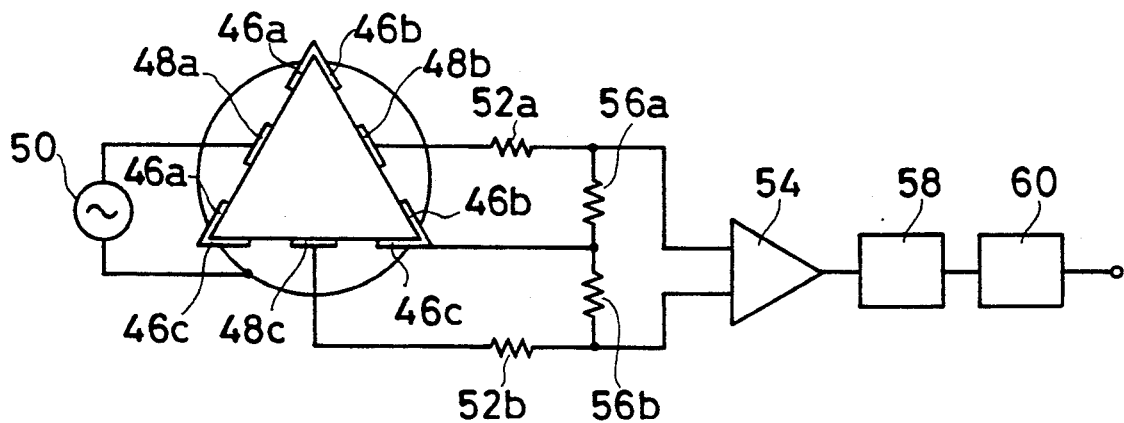
FIG. 9 is a circuit diagram showing an example of an angular velocity detecting circuit using a vibrator shown in FIG. 6 and FIG. 7.

For using the vibrator 20 as an angular velocity sensor, for example, an angular velocity detecting circuit as shown in FIG. 9 is used. That is, an oscillation circuit output source 50 is connected between the comblike electrodes 46a–46c and the comblike electrode 48a. The comblike electrode 48b is connected to one input side of the differential amplifier circuit 54 via a resistance 52a, and the comblike electrode 48c is connected to the other input side of the differential amplifier circuit 54 via a resistance 52b. Moreover, the comblike electrodes 46a–46c are connected to one input side of the differential amplifier circuit 54 via a separate resistance 56a, and further, to the other input side of the differential amplifier circuit 54 via a resistance 56b.

The output side of the differential amplifier circuit 54 is connected to a synchronous detection circuit 58, which is in turn connected to ripple filter 60.

Figure 10:
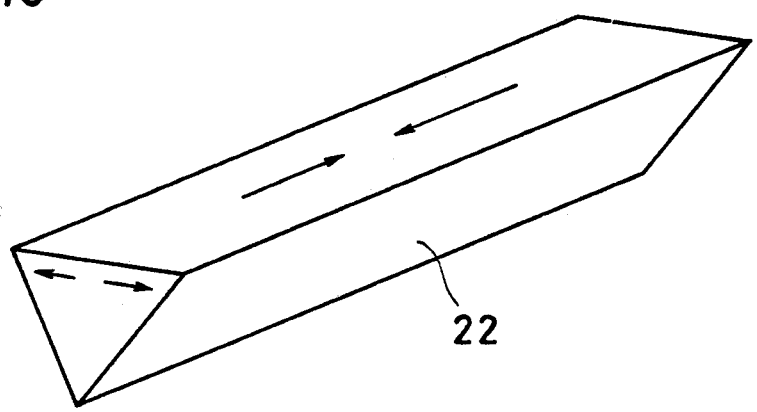
FIG. 10 is an illustrative view showing the state wherein a vibrator is excited by a circuit shown in FIG. 9.

In the vibrator 20, when the signal from the oscillation circuit output source 50 is applied and the comblike electrode 48a is made positive and the comblike electrode 46a is made negative as shown in FIG. 10, the vibrating body 22 extends laterally and contracts longitudinally. When the signal is reversed, the vibrating body 22 contracts laterally, and extends longitudinally. In such a way, the vibrating body 22 bends and vibrates in the direction orthogonal to the plane whereon the comblike electrode 48a is formed.

When the vibrator 20 is rotated about its axis, a coriolis force is exerted in the direction orthogonal to the bending and vibrating direction. Thus, the vibrating direction of the vibrating body 22 is shifted from the non-rotational vibrating direction. Therefore, difference of output voltages produced between the comblike electrodes 48b and 48c is produced, and the output is obtained from the differential amplifier circuit 54. The output from the differential amplifier circuit 54 is detected in the synchronous detection circuit 58, and by further passing through the ripple filter 60, the DC output is obtained. Accordingly, by measuring the DC output, the rotational angular velocity applied on the vibrator 20 can be measured.

In the vibrator 20, the inter-digital electrodes 24a, 24b and 24c can be used for polarization of the vibrating body 22, as well as, for excitation and output voltage detection. Thus, in the vibrator 20, it is not necessary to form an electrode separately for polarization and its manufacturing method is simple, resulting in low manufacturing costs.

Incidentally, in the aforementioned embodiment, though the oscillation circuit output source 50 is connected between the comblike electrode 48a and the comblike electrodes 46a–46c, as shown in FIG. 11, the oscillation circuit output source 50 may be connected between the comblike electrodes 48a, 48b and the comblike electrode 48c. In this case, the vibrating body 22 bends and vibrates in the direction orthogonal to the plane whereon the comblike electrode 48c is formed.

As the shape of inter-digital electrodes 24a–24c, for example, as shown in FIG. 12, it may formed such that the teeth of a comb extend in the lateral direction of the side face of the vibrating body 22. Also in this case, polarization is effected between the opposing comblike electrodes.

The number of teeth of the comblike electrode can be changed optionally. By changing the number of teeth, the capacity can be controlled.

FIG. 13 is a perspective view showing still another embodiment of the present invention, and FIG. 14 is a sectional view taken along the line XIV—XIV of FIG. 13. The vibrator 20 includes the vibrating body 22. The vibrating body 22 is formed, for example, into a regular triangle column by piezoelectric ceramics. In the vibrating body 22, a regular triangle columnar through hole 64 is formed directing axially thereof. Meanwhile, the vibrating body 22 is polarized radially from its inner circumferential surface toward the peripheral surface. The vibrating body 22 is supported in the neighborhood of its nodal point.

Throughout the inner circumferential surface of the vibrating body 22, an internal electrode 66 is formed. Moreover, on three side faces of the vibrating body 22, external electrodes 24a, 24b and 24c are formed respectively at the center. These internal electrode 66 and the external electrodes 24a–24c are formed by, for example, silver or the like by silver paste sintering, plating, vacuum evaporation and sputtering methods.

For manufacturing the vibrator 20, the vibrating body 22 formed with the through hole 64 is prepared. Throughout the inner circumferential surface and peripheral surface of the vibrating body 22, as shown in FIG. 15, the internal electrode 66 and a peripheral electrode 70 are formed by the silver paste sintering, plating, vacuum evaporation and sputtering methods. Then, by applying an electric field between the internal electrode 66 and the peripheral electrode 70, as indicated by the arrow, the vibrating body 22 is polarized radially from the inner circumferential surface toward the peripheral surface.

Next, by removing unnecessary portions of the peripheral electrode 70, the external electrodes 24a, 24b and 24c are formed.

For using the vibrator 20 as an angular velocity sensor, for example, an angular velocity detecting circuit as shown in FIG. 16 is used. That is, resistances 72, 74 are connected to the two external electrodes 24a, 24b. And, an oscillation circuit output source 50 is connected between the resistance 72, 74 and the other external electrode 24c. By the signal from this oscillation circuit output source 50, the vibrating body 22 bends and vibrates in the direction orthogonal to the surface of the external electrode 24c.

Meanwhile, separate resistances 78, 80 are connected to the two external electrodes 24a, 24b. The resistances 78, 80 are connected to the input side of the differential amplifier circuit 54. Furthermore, the output side of the differential amplifier circuit 54 is connected to a synchronous detection circuit 58, which is in turn connected to a ripple filter 60.

When the vibrating body 22 bends and vibrates by the signal from the oscillation circuit output source 50, as the vibrating body 22 is rotated about its axis, corresponding to the rotational angular velocity, a coriolis force is exerted in the direction orthogonal to the vibrating direction. Thereby, the vibrating direction of the vibrating body 22 shifts from the non-rotational vibrating direction. Thus, differences in output voltages are produced between the two external electrodes 24a, 24b, and the output is obtained from the differential amplifier circuit 54.

The output obtained from the differential amplifier circuit 54 is detected synchronously in the synchronous detection circuit 58, and by passing through the ripple filter 60, the DC output is obtained. Accordingly, by measuring the DC output, the rotational angular velocity applied to the vibrator 20 can be measured.

In the vibrator 20, the internal electrode 66 and the external electrodes 24a–24c may be formed in the vibrating body 22 formed with a piezoelectrical material. These electrodes may be formed simply by the silver paste sintering, plating, vacuum evaporation and sputtering.

Besides the external electrodes 24a–24c may be formed by removing unnecessary portions of the peripheral electrode 70. The peripheral electrode 70 may be used for polarizing the vibrating body 22. That is, in the vibrator 20, the external electrodes 24a–24c can be formed by utilizing the peripheral electrode 70 for polarizing the vibrating body 22. Accordingly, the vibrator 20 can be manufactured simply and at low cost as compared with the conventional vibrator.

Also, by forming the through hole 64 in the triangle columnar vibrating body 22, as compared with the vibrating body of the same shape with no through hole, the resonance frequency can be reduced and its sensitivity can be improved. In case of the equal sensitivity, the vibrating body 22 can be made smaller than that without the through hole.

In the above embodiment, though the oscillation circuit output source 50 is connected between the external electrodes 24a, 24b and the external electrode 24c, as shown in FIG. 17, the oscillation circuit output source 50 may be connected between the internal electrode 66 and the external electrode 24c. Also, as shown in FIG. 18, the oscillation circuit output source 50 may be connected between the internal electrode 66 and the two external electrodes 24a, 24b. In order to accomplish the circuit configuration as these embodiments, as shown in FIG. 19, the internal electrode 66 may be formed by drawing from the end face to the side face of the vibrating body 22.

The shape of the through hole 64 is not limited to the triangle column, it may be an other shape such as a cylinder as shown in FIG. 20. Furthermore, the shape of the vibrating body 22 is not limited to the triangle column, it may be a hexagonal column as shown in FIG. 21 or any other polygonal column.

Figure 22:
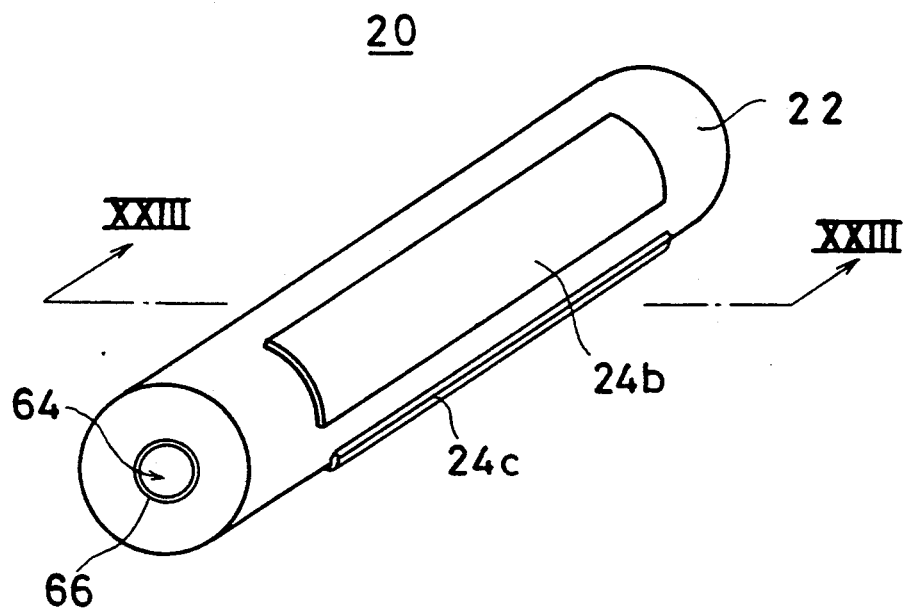
FIG. 22 is a perspective view showing a separate embodiment the present invention.
Figure 23:
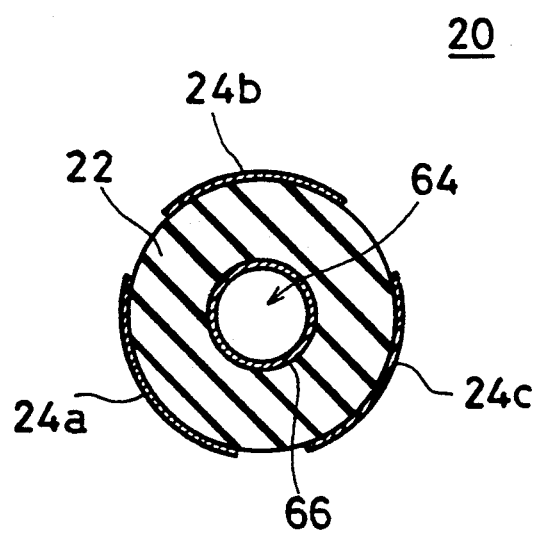
FIG. 23 is a sectional view taken along the line XXIII—XXIII of FIG. 22.

FIG. 22 is a perspective view showing another embodiment of the present invention, and FIG. 23 is a sectional view taken along the line XXIII—XXIII of FIG. 22. In this embodiment, the vibrating body 22 is formed cylindrically. In the vibrating body 22, a circular through hole 64 is axially formed. Meanwhile, the vibrating body 22 is polarized radially from its inner circumferential surface toward the peripheral surface.

The vibrating body 22 is supported in the neighborhood of its nodal point.

Throughout the inner circumferential surface of the vibrating body 22, an internal electrode 66 is formed. On the peripheral surface of the vibrating body 22, generally trisecting its periphery, external electrodes 24a, 24b and 24c are formed. Meanwhile, these external electrodes 24a-24c are so formed that their faces are spaced from each other.

Figure 24:
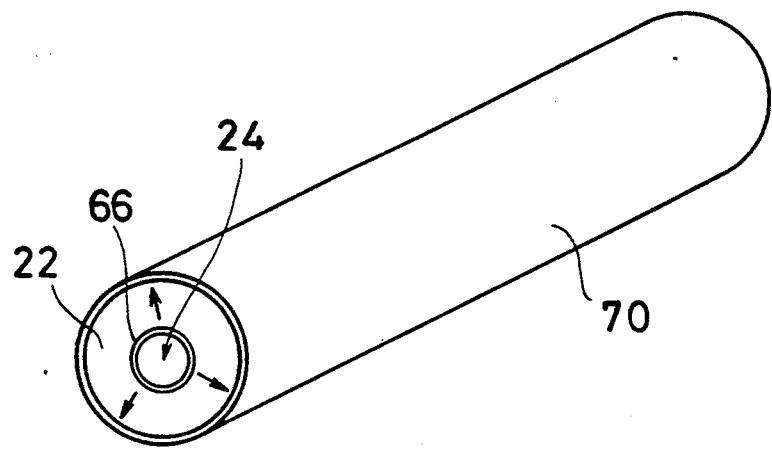
FIG. 24 is a perspective view showing a process for manufacturing a vibrator shown in FIG. 22 and FIG. 23.

In manufacturing the vibrator 20, as shown in FIG. 24, the internal electrode 66 and peripheral electrode 70 are formed. By applying an electric field between the internal electrode 66 and the peripheral electrode 70, as indicated by the arrow, the vibrating body 22 is polarized radially from its inner circumferential surface toward the peripheral surface.

Next, by removing unnecessary portions of the peripheral electrode 70, external electrodes 24a, 24b, 24c are formed.

In order to use this vibrator 20 as an angular velocity sensor, an angular velocity detecting circuit similar to that shown in FIG. 16, FIG. 17 and FIG. 18 is used. Thereby, the rotational angular velocity can be measured in the same manner as the vibrator 20 shown in FIG. 13 and FIG. 14.

In this vibrator 20, since the vibrating body 22 is formed cylindrically, uniform polarization can be effected between the internal electrode 66 and the external electrodes 24a, 24b and 24c.

Besides, since the vibrating body 22 itself is formed cylindrically, a metal mold for manufacturing the vibrating body 22 can be made simply. Accordingly, this vibrator 20 can be manufactured simply and at low cost, as compared with conventional angular velocity sensors. Also, in this case, if the machining accuracy is obtained at the beginning, the resonance frequencies at the bending and vibrating of the vibrating body 22 in various directions are liable to coincide. Thus, as compared with other shapes, the machining accuracy of the vibrating body 20 can be easily controlled by centerless grinding and so on.

Also, in this vibrator 20, by forming a through hole 64 in the cylindrical vibrating body 22, as compared with the vibrating body of the same shape without the through hole, the resonance frequency can be reduced and its sensitivity can be improved. With an equal sensitivity, the vibrating body 22 can be made smaller than that with no through hole.

Figure 25:
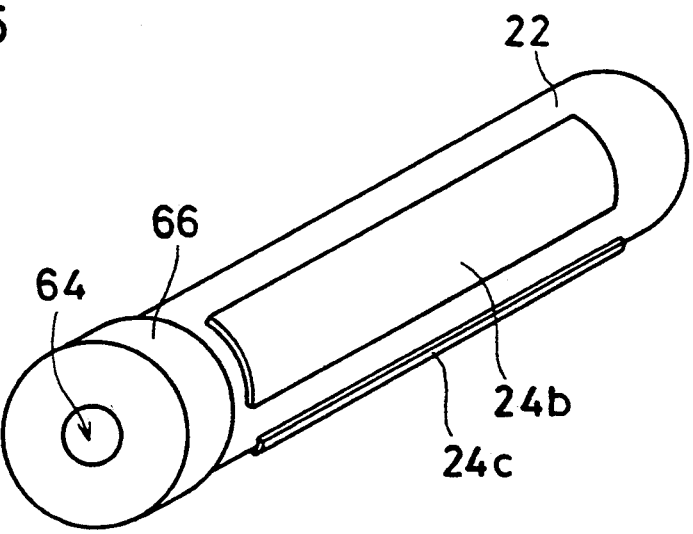
FIG. 25 is a perspective view showing another example of a vibrator shown in FIG. 22 and FIG. 23.

The shape of the internal electrode 66, as shown in FIG. 25, may be formed by drawing from the end face to the side face of the vibrating body 22.

While the invention has been particularly described and shown, it is to be understood that such description is for illustrative purposes only and not as the spirit and scope of the invention is determined solely by the terms of the appended claims.

What is claimed is:

1. A vibrator comprising:
a monolithic triangle columnar vibrating body made of a piezoelectric material; and
three external electrodes formed on three side faces of said vibrating body, wherein said vibrating body is polarized in a direction orthogonal to one of said three external electrodes.

2. A vibrator comprising:
a monolithic triangle columnar vibrating body made of a piezoelectric material;
three external electrodes formed on three side faces of said vibrating body;
a through hole formed and directed axially of said vibrating body; and
an internal electrode formed on an inner circumferential surface of said vibrating body, wherein said vibrating body is polarized in a direction from the inner circumferential surface to an outer peripheral surface.

3. A vibrator comprising:
a monolithic cylindrical vibrating body made of a piezoelectric material;
three external electrodes formed at regular intervals in an outer circumferential direction of said vibrating body;
a through hole formed on an inner circumferential surface of said vibrating body, wherein said vibrating body is polarized in a direction from the inner circumferential surface to an outer peripheral surface.

4. A vibrator comprising:
a triangle columnar vibrating body made of a piezoelectric material; and
three external electrodes formed on three side faces of said vibrating body, each of said three external electrodes being formed as an inter-digital electrode having a pair of comb-like electrodes arranged so as to inter-align with each other, one of the pair of comb-like electrodes of said inter-digital electrode being interconnected with a comb-like electrode form each of the inter-digital electrodes of other external electrodes, and said vibrating body being polarized between the comb-like electrodes of said three external inter-digital electrodes.

* * * * *